United States Patent [19]

Sakaino et al.

[11] Patent Number: 5,304,803
[45] Date of Patent: Apr. 19, 1994

[54] INFRARED IMAGING ARRAY

[75] Inventors: Go Sakaino; Yasuaki Yoshida, both of Itami, Japan

[73] Assignee: Mitsubishi Denki Kabushiki Kaisha, Tokyo, Japan

[21] Appl. No.: 34,124

[22] Filed: Mar. 18, 1993

[30] Foreign Application Priority Data

Aug. 11, 1992 [JP] Japan .................. 4-236555

[51] Int. Cl.$^5$ .................. H01L 31/0224
[52] U.S. Cl. .................. 250/332; 257/291
[58] Field of Search .......... 250/332, 330; 257/290, 257/291, 292

[56] References Cited

U.S. PATENT DOCUMENTS 4,694,316 9/1987 Chabbal .................. 357/24

FOREIGN PATENT DOCUMENTS

| 0281178 | 9/1988 | European Pat. Off. |
| 57-141960 | 9/1982 | Japan . |
| 63-65668 | 3/1988 | Japan .................. 257/291 |
| 64-71770 | 3/1989 | Japan .................. 257/291 |
| 2-198282 | 8/1990 | Japan . |
| 1457253 | 12/1972 | United Kingdom . |
| 2136657 | 5/1984 | United Kingdom . |

OTHER PUBLICATIONS

Chow et al., "Hybrid Infrared Focal-Plane Arrays", IEEE Transactions on Electron Devices, vol. ED-29, No. 1, Jan. 1982, pp. 3-13.

Primary Examiner—Paul M. Dzierzynski
Assistant Examiner—Richard Hanig
Attorney, Agent, or Firm—Leydig, Voit & Mayer

[57] ABSTRACT

An infrared imaging array includes a plurality of photodetectors arranged in a two-dimensional array. A first charge read-out gate is associated with each photodetector and reads out electrical charges from the associated photodetector receiving first charge read-out clock pulses output from a vertical scanner. A charge storage element is connected to each column of photodetectors and includes a storage gate opposite which a potential well is formed in a substrate. The electrical charges transferred from the photodetectors in each column are stored in the potential well. A second charge read-out gate is associated with each charge storage element and transfers the electrical charges stored in the associated charge storage element to an output diode receiving second charge read-out clock pulses from a horizontal scanner. In the present invention, an insulating film underlying the charge storage gate has a thickness that decreases stepwise in the charge transfer direction so that the depth of the potential well created opposite the storage gate increases stepwise, producing an electric field in the charge transfer direction. Therefore, a small quantity of electrical charges remaining in the potential well drift in response to the electric field, increasing charge transfer speed.

6 Claims, 9 Drawing Sheets

INFRARED IMAGING ARRAY

FIELD OF THE INVENTION

The present invention relates to an infrared imaging array that reduces the time required for transferring electrical charges from a charge storage part to a charge output part.

BACKGROUND OF THE INVENTION

FIG. 6 is a perspective view illustrating a two-dimensional imaging array. This array includes a two-dimensional array of photodiodes 1, for example, 128×128 photodiodes, for generating electrical signals in response to light incident on the respective photodiodes. The photodiode array is mounted on and electrically connected to a p type silicon substrate 50a containing signal processing circuitry. Each photodiode is in electrical communication with a respective signal processing circuit in the substrate 50a through a columnar body 30, such as a cylindrical volume of indium. This construction is particularly applicable to an infrared light detector in which incident infrared light 200 strikes the photodiode array 1. The photodiode array 1 comprises cadmium mercury telluride ($Cd_{0.2}Hg_{0.8}Te$) that responds to infrared light in 10 micron band.

The general electrical arrangement of the imaging array of FIG. 6 is shown schematically in FIG. 7. For simplicity, FIG. 7 shows a 3×3 array of photodiodes 1a to 1i, i.e., an array including three photodiodes in each of three rows. The photodiodes 1a to 1i are connected to the source regions of vertical switch MOS transistors 2a to 2i, respectively, via the columnar connectors 30. A vertical scanner 3 is commonly connected to the gate electrodes of the vertical switch MOS transistors 2a to 2i. The drain regions of the vertical switch MOS transistors 2a to 2i are connected to charge storage capacitors 4x, 4y, and 4z. The charge storage capacitors 4x, 4y, and 4z are connected to the source regions of horizontal switch MOS transistors 5a, 5b, and 5c, respectively. A vertical scanner 6 is commonly connected to the gate electrodes of the horizontal switch MOS transistors 5a to 5c. A floating diffusion amplifier (hereinafter referred to as FDA) output circuit 7 is commonly connected to the drain regions of the horizontal switch MOS transistors 5a to 5c. Reference numeral 8 designates an output terminal.

In operation, incident light causes the photodiodes 1a to 1i to produce electrical charges that are conducted through the indium connectors 30 to the respective vertical switch MOS transistors 2a to 2i. Receiving clock pulses from the vertical scanner 3, the vertical switch MOS transistors in each column transfer electrical charges to one of the charge storage capacitors 4x to 4z. Receiving clock pulses from the horizontal scanner 6, the horizontal switch MOS transistor transfers electrical charges stored in the charge storage capacitor to the FDA output circuit 7.

FIGS. 9(a) to 9(c) are schematic diagrams illustrating the signal processing circuitry of the infrared imaging device and potential wells produced in the p type silicon substrate 50a. In the figures, the same reference numerals as in FIG. 7 designate the same or corresponding parts. Reference numeral 1A designates a photodiode arbitrarily selected from the photodiodes 1a to 1i. Reference numeral 2 designates one of the vertical switch MOS transistors 2a to 2i which corresponds to the photodiode 1A. Reference numeral 4 designates one of the charge storage capacitors 4x to 4z, which corresponds to the photodiode 1A. The charge storage capacitor 4 includes an injection gate 4a and a storage gate 4b. Reference numeral 5 designates one of the horizontal switch MOS transistors 5a to 5c, which corresponds to the charge storage capacitor 4. Reference numerals 11 and 12 designate an input diode and an output diode, respectively. The FDA output circuit 7 includes an FDA output gate 7a, an FDA source follower 7b connected to the FDA output gate 7a, and a resistance 7c connected between the FDA output gate 7b and the ground. Reference numeral 9 designates an FDA overflow reset gate for draining electrical charges stored in the potential well created opposite the output diode 12 to an FDA reset drain 10. Reference numeral 13 designates an FDA overflow reset gate for draining electrical charges stored in the potential well created opposite the storage gate 4b to an overflow drain 14. All of the gates described above are by MOS switches. In FIGS. 9(a)–9(c), for convenience, the vertical switch MOS transistor 2, the FDA overflow reset gate 9, the FDA reset drain 10, the FDA output circuit 7, the FDA overflow reset gate 13, and the overflow drain 14 are shown disposed apart from the p type silicon substrate 50a. However, these elements are included in the substrate 50a.

FIG. 8 is a block diagram illustrating an infrared imaging apparatus in which the imaging array 50 is interconnected with other components. Electrical charges output from the infrared imaging array 50 are converted to electrical imaging signals by a scan converter 51 and displayed on a television monitor 52 as a visible image. To coordinate the reading out of the sequential electrical imaging signals from the array 50 with the conversion of those signals into a two-dimensional image in the scan converter 51, a timing generator 53 provides timing signals to both the array 50 and the scan converter 51.

FIG. 10 is a schematic diagram showing clock pulses $\phi V$, $\phi RS$, $\phi R$, and H1 applied to the respective gate terminals of the infrared imaging array 50 and the voltage waveform of an output signal DVo 1 from the output terminal 8. The clock pulses $\phi V$ and $\phi H1$ are generated from the vertical scanner 3 and the horizontal scanner 6, respectively, and the clock pulses $\phi RS$ and $\phi R$ are generated from other scanners (not shown). The timing of each clock pulse is determined by the timing generator 53 of FIG. 8.

A description is given of the operation of the infrared imaging array.

When the clock pulse $\phi V$ from the vertical scanner 3 is applied to the gate of the vertical switch MOS transistor (hereinafter referred to as a vertical scanner gate) 2, three photodiodes in a prescribed row, for example, the photodiodes 1a, 1b, and 1c in the uppermost row shown in FIG. 6, are selected from the photodiodes 1a to 1i.

Turning to FIG. 9(a), when the clock pulse $\phi RS$ applied to the overflow electrode 13 and the clock pulse $\phi V$ applied to the vertical scanner gate 2 are both at "H" level, electrical charges generated in the photodiode 1A, which is one of the three photodiodes selected, are transferred through the vertical scanner gate 2 and a potential well created opposite the input diode 11 to a potential well created opposite the storage gate 4b, and then the electrical charges are drained through the overflow electrode 13 to the overflow drain 14. When the clock pulse $\phi RS$ decreases to "L" level to close the overflow electrode 13, electrical charges transferred from the photodiode 1A are accumulated in the potential well beneath the storage gate 4b. After the charge accumulation, when the clock pulse φR applied to the FDA reset gate 9 increases to "H" level to open the FDA reset gate 9, the potential of the output diode 12 increases and a high voltage is applied to the output terminal 8 because a constant voltage power supply (not shown) is connected to the FDA reset drain 10. Then, the clock pulse φR decreases to "L" level to produce a potential well beneath the output diode 12. In this state, when the read-out clock pulse φH1 recurring at regular intervals shown in FIG. 10 is applied to the gate of the horizontal switch MOS transistor (hereinafter referred to as horizontal scanner gate) 5, the electrical charges stored in the potential well beneath the storage gate 4b are transferred to the potential well beneath the output diode 12 while the clock pulse φH1 is at "H" level, i.e., while the horizontal scanner gate 5 is open (FIG. 9(c)). The width of each pulse of the read-out clock φH1 corresponds to the time interval required for opening one horizontal scanner gate 5. Receiving the read-out clock pulse φH1, the horizontal scanner gates 5a, 5b, and 5c successively open in this order and electrical charges stored in the charge storage capacitors 4x, 4y, and 4z are successively read out. The gate voltage of the FDA output gate 7a changes during every transfer of electrical charges stored in the charge storage capacitor 4 to the output diode 12, and the current flowing to the FDA output gate 7a from the constant-voltage source connected to the FDA source follower 7b is reduced, whereby the output signal DVo 1 having a voltage shape shown in FIG. 10 is output from the output terminal 8.

In the above-described operation, the pulse width of the read-out clock φH1 is equivalent to the time interval for reading out electrical charges of one photodiode, i.e., pixel, and this charge read-out time interval is usually as long as or a little longer than the time interval during which electrical charges stored in the potential well beneath the storage gate 4b are completely transferred to the potential well beneath the output diode 12. Hereinafter, this time interval is called an actual read-out time.

In the above-described operation, before transferring electrical charges to the potential well beneath the output diode 12, a "H" level pulse is applied to the FDA reset gate 9 to completely eliminate electrical charges from the potential well beneath the output diode 12 during every reading out of electrical charges for each pixel.

FIG. 11(a) is a plan view illustrating the charge storage gate 4b and its vicinity and FIG. 11(b) is a sectional view taken along line XIb—XIb of FIG. 11(a). In the figures, the same reference numerals as in FIGS. 6, 7, and 9(a)-9(c) designate the same or corresponding parts. Reference numeral 60 designates an insulating film about 500 angstroms thick comprising silicon oxide. As shown in FIG. 11(a), the storage gate 4b of the charge storage capacitor 4 is long and narrow in the charge transfer direction to increase the volume of the potential well created opposite the storage gate 4b, whereby a large quantity of electrical charges generated in the photodiode are stored in the potential well. For example, the storage gate 4b has a width of about 80 microns and a length of about 300 microns.

The charge transfer from the potential well beneath the storage gate 4b to the potential well beneath the output diode 12 is carried out by self induced drift of the electrical charge itself and thermal diffusion of the electrical charge due to the heat from the p type substrate. In the initial stage of the charge transfer operation where a lot of electrical charges remain in the potential well beneath the storage gate, the charges are rapidly transferred to the potential well beneath the output diode 12 by the self-induced drift of the charges. However, in the final stage of the charge transfer operation where a small quantity of charges remains in the potential well beneath the storage gate, the self-induced drift of the charge decreases and the charge transfer is carried out only by thermal diffusion, increasing the charge transfer time. That is, the longer the potential well created beneath the storage gate 4b is, the longer the charge transfer time becomes. Therefore, when the length of the storage gate 4b is increased in the charge transfer direction to store a large quantity of electrical charges, in order to completely transfer the electrical charges to the potential well beneath the output diode, the pulse width of the read-out clock φH applied to the vertical scanner gate 5 has to be increased to increase the time interval during which the vertical scanner gate 5 is open, i.e., the time interval for reading out the charges.

Meanwhile, when an output image is displayed on a TV monitor, it takes 1/60 sec. to process one frame. Therefore, when an output signal from the above-described infrared imaging array is displayed on a TV monitor as an image, the pulse width of the read-out clock φH1, i.e., the charge read-out time, is about 1 μs. Recently, an increase in the frame rate, i.e., a reduction in the time required for processing one frame, has been proposed to faithfully capture an image of a target moving at high speed. In this case, however, it is necessary to further reduce the charge read-out time from 1 μs.

In the conventional infrared imaging array described above, however, if the length of the storage gate 4b is increased in the charge transfer direction to increase the quantity of charges stored in the potential well beneath the storage gate 4b, the time required for transferring the charges to the potential well beneath the output diode 12, i.e., the actual read-out time, is increased. In this state, if the pulse width of the read-out clock φH1 applied to the horizontal scanner gate 5, i.e., the actual read-out time, is made lower shorter than 1 μs to operate the imaging array in a TV frame, the quantity of charges transferred from the potential well beneath the storage gate to the potential well beneath the output diode 12 unfavorably decreases, resulting in poor resolution of the image attained.

SUMMARY OF THE INVENTION

It is an object of the present invention to provide an infrared imaging array that can reduce the time required for transferring electrical charges from a charge storage gate to an output diode.

Other objects and advantages of the present invention will become apparent from the detailed description given hereinafter. The detailed description and specific embodiments are provided for illustration only, since various additions and modifications within the spirit and scope of the invention will become apparent to those skilled in the art from the detailed description.

According to an aspect of the present invention, in an infrared imaging array, a potential well created opposite a charge storage gate has depth gradually increasing in the charge transfer direction, producing a potential gradient in the well that causes an electric field in the charge transfer direction. Therefore, a small quantity of electrical charges remaining in the potential well drift due to the electric field, increasing the charge transfer speed.

DETAILED DESCRIPTION OF THE PREFERRED EMBODIMENTS

Figure 1:
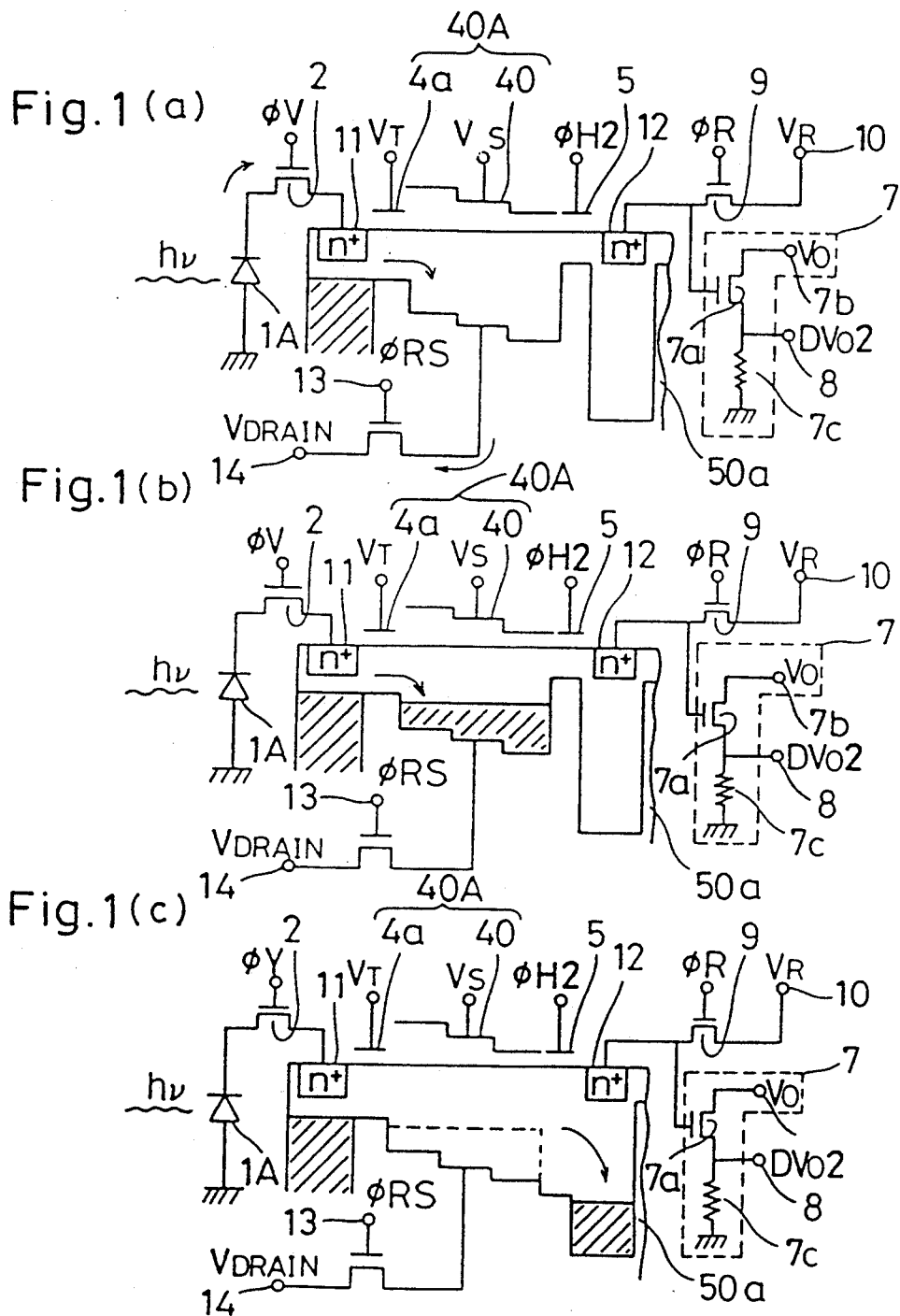
FIGS. 1(a)-1(c) are schematic diagrams illustrating signal processing circuitry of an infrared imaging array and potential wells created in a p type silicon substrate, in accordance with a first embodiment of the present invention.
Figure 3:
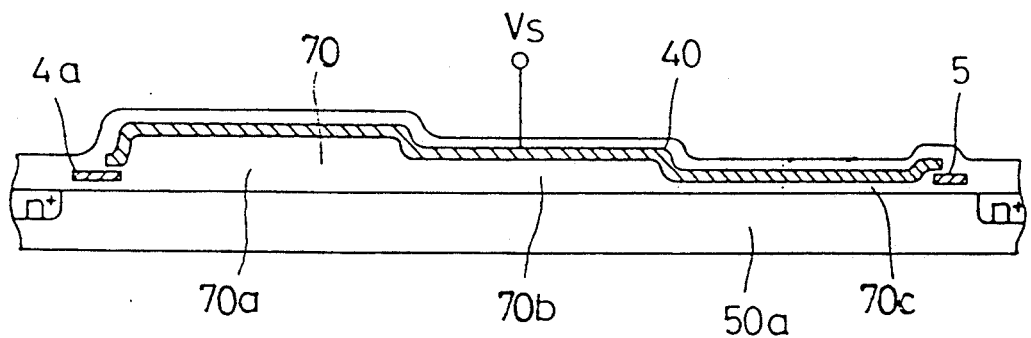
FIG. 3 is a cross-sectional view illustrating a charge storage gate and its vicinity included in the infrared imaging array according to the first embodiment of the present invention.

FIGS. 1(a) to 1(c) are schematic diagrams illustrating signal processing circuitry of an infrared imaging device according to a first embodiment of the present invention and potential wells produced in a p type silicon substrate. FIG. 3 is a cross-sectional view illustrating a charge storage gate and its vicinity included in the infrared imaging array. In the figures, the same reference numerals as in FIGS. 9(a)-9(c) and 11(a)-11(b) designate the same or corresponding parts. In the infrared imaging array of the first embodiment, as shown in FIG. 3, a charge storage gate 40 is formed in steps that step closer to the p type silicon substrate 50a in the charge transfer direction, i.e., in the direction from the injection gate 4a toward the horizontal scanner gate 5. The thickness of the insulating film 70 beneath the stepped storage gate 40 decreases in the charge transfer direction. When a constant voltage $V_S$ is applied to the storage gate 40, the electric field strength beneath the storage gate 40 varies due to the varying thickness of the insulating film 70, more specifically, the electric field strength is high under a thick portion 70a of the insulating film and low under a thin portion 70c of the insulating film, whereby the depth of the potential well created opposite the storage gate 40 is increased stepwise in the charge transfer direction as shown in FIG. 1(a). The thicknesses of the portions 70a, 70b, and 70c of the insulating film are about 800, 500, and 200 angstroms, respectively, although the thicknesses depend on the voltage $V_S$ applied to the storage gate.

In producing the insulating film 70, initially, a first silicon oxide film having a prescribed thickness is deposited on a portion of the p type silicon substrate 50a where the storage gate 40 is to be formed, and a prescribed portion of the first silicon oxide film is masked with a first resist pattern, followed by a deposition of a second silicon oxide film having a prescribed thickness. Thereafter, the first resist pattern and overlying portion of the second silicon oxide film are removed by the conventional lift-off technique, forming the portions 70c and 70b of the insulating film 70. Then, a prescribed portion of the second silicon oxide film is masked by a second resist pattern, followed by a deposition of a third silicon oxide film and lift-off, forming the portion 70a of the insulating film 70.

Figure 6:
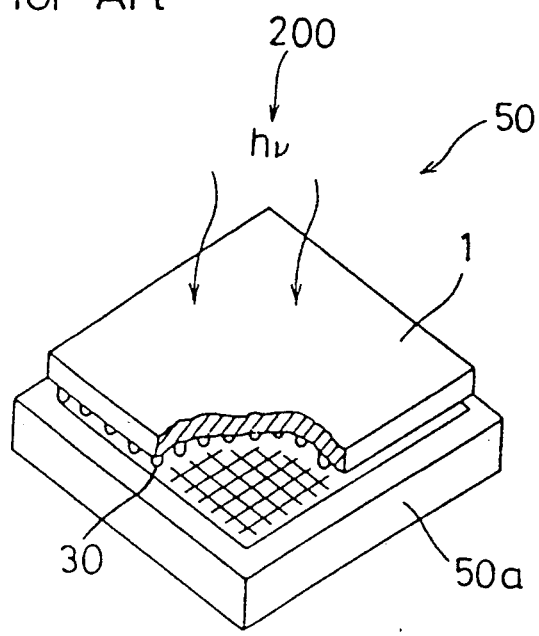
FIG. 6 is a perspective view, partially broken away, of an infrared imaging array according to the prior art.
Figure 7:
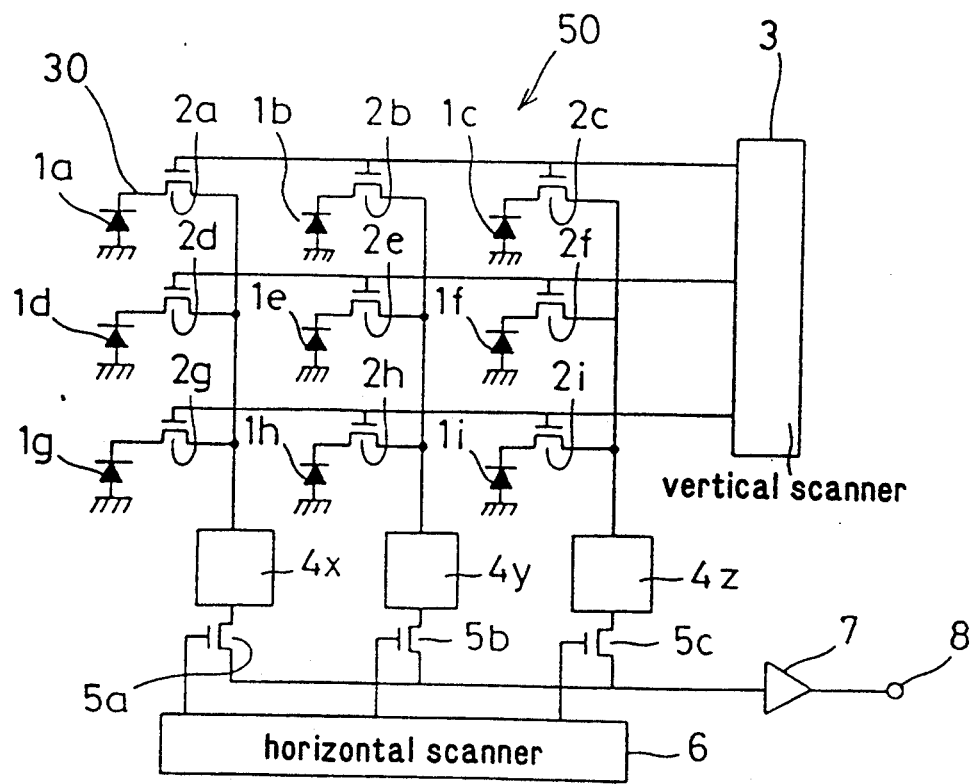
FIG. 7 is a block diagram of an infrared imaging array according to the prior art.

The whole structure of the infrared imaging array according to the first embodiment is fundamentally identical to the prior art infrared imaging array shown in FIGS. 6 and 7, and the charge storage capacitor 40A of this embodiment corresponds to one of the charge storage capacitors 4x to 4y shown in FIG. 7.

Figure 8:
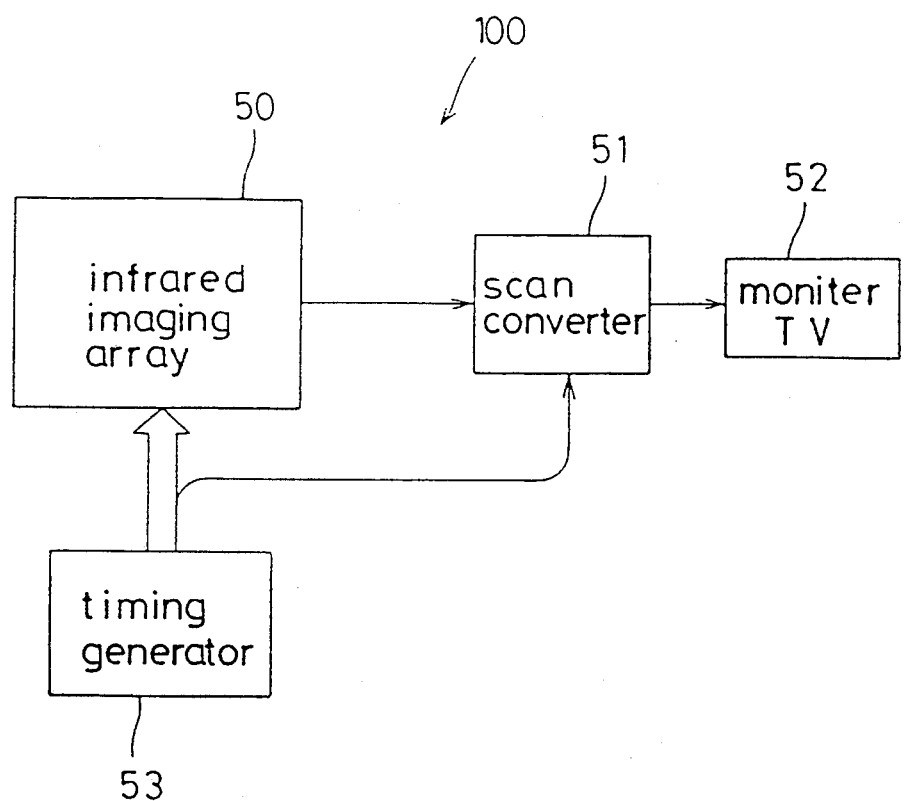
FIG. 8 is a block diagram of an infrared imaging apparatus including the imaging array of FIG. 7.
Figure 9A:
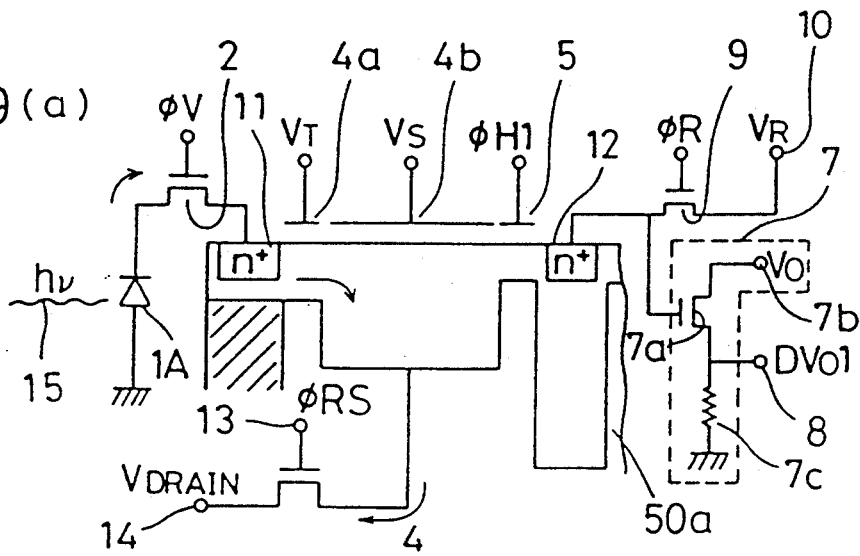
FIGS. 9(a)-9(c) are schematic diagrams illustrating signal processing circuitry of the infrared imaging array of FIG. 7 and potential wells created in a p type silicon substrate.
Figure 9B:
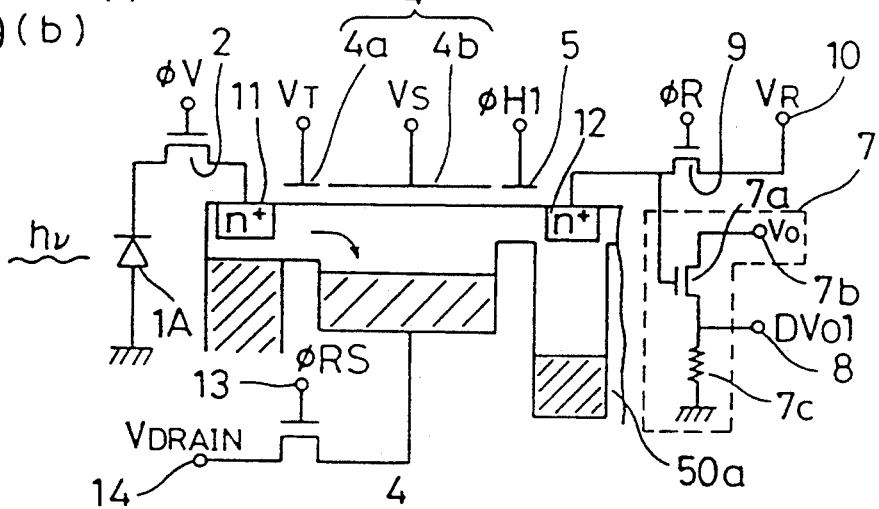
Figure 9C:
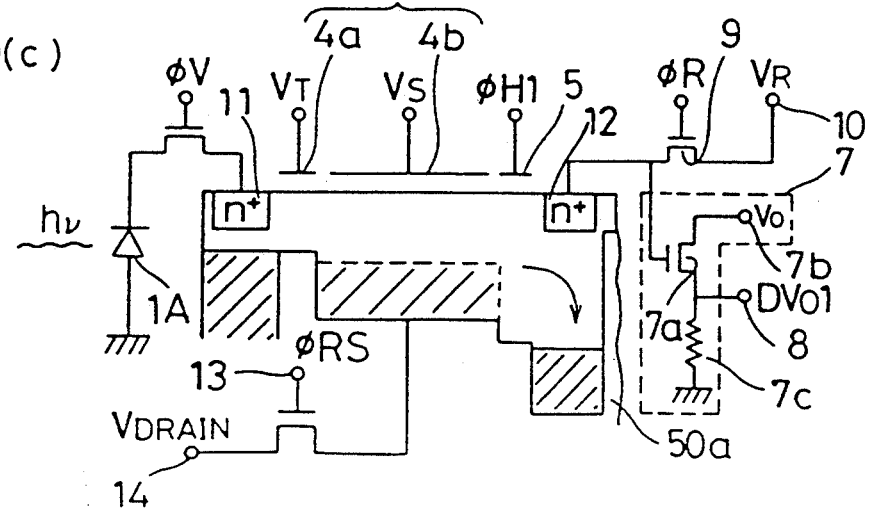

When the infrared imaging array is operated in a TV frame, it is interconnected with other components as shown in FIG. 8.

A description is given of the operation.

In the following description, it is supposed that the quantity of the electrical charges generated from each photodiode, the quantity of electrical charges stored in the potential well beneath the storage gate, and the width and length of the storage gate are approximately equal to those of the conventional device.

Figure 10:
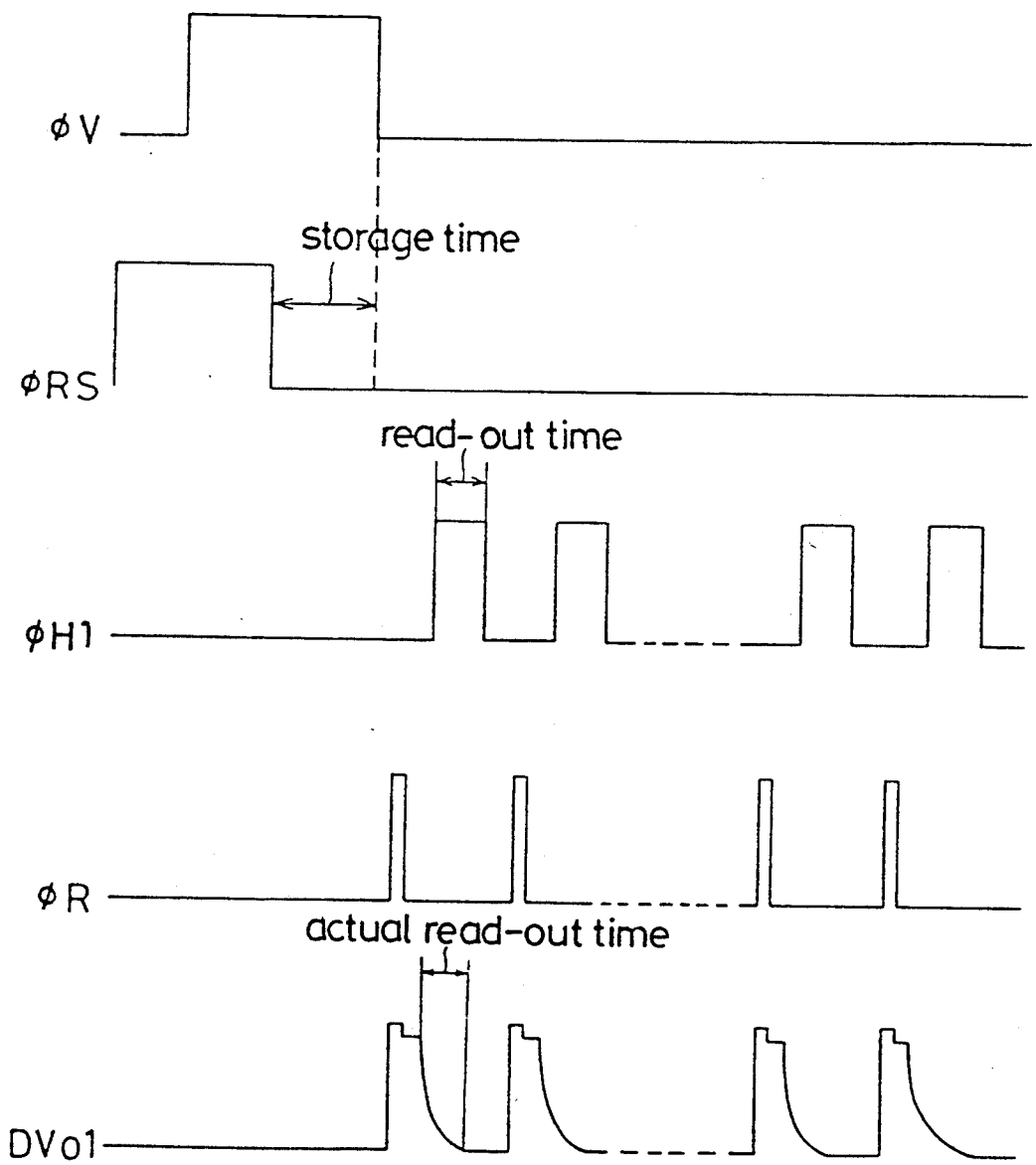
FIG. 10 is a schematic diagram illustrating clock pulses applied to the respective gate terminals of the infrared imaging array of FIG. 7 and the waveform of an output signal.
Figure 11:
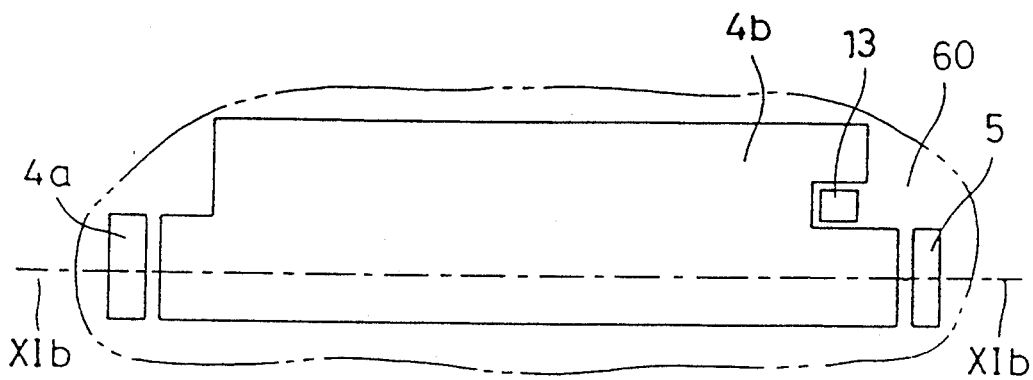
FIGS. 11(a) and 11(b) are a plan view and a cross-sectional view illustrating a charge storage gate and its vicinity included in the infrared imaging array of FIG. 7.
Figure 11:
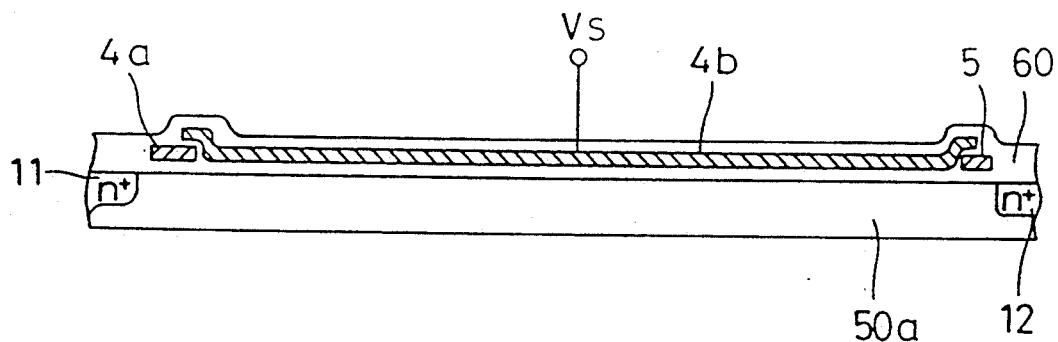

In addition, the fundamental operation is identical to that of the conventional device, and the clock pulses applied to the vertical scanner gate 2, the overflow electrode 13, the horizontal scanner gate 5, and the FDA reset gate are identical to those shown in FIG. 10.

The pulse shape of the charge read-out clock $\phi H2$ applied to the horizontal scanner gate 5 is illustrated in FIG. 5(a) and the voltage waveform of the output signal DVo 2 for one pixel, which is output from the output terminal 8, is illustrated in FIG. 5(b). In the figures, reference characters A and B designate actual read-out time intervals according to the present invention and the prior art, respectively.

Initially, the clock pulses $\phi V$ and $\phi RS$ shown in FIG. 10 are applied to the vertical scanner gate 2 and the overflow electrode 13, respectively. While the clock pulse RS applied to the overflow drain 13 is at "H" level, electrical charges transferred from the photodiode 1A to the potential well beneath the storage gate 40 are drained through the overflow electrode 13 to the overflow drain 14. When the clock pulse $\phi RS$ decreases to "L" level, electrical charges transferred from the photodiode 1A are accumulated in the potential well beneath the storage gate 40, the depth of which increases stepwise in the charge transfer direction. After a while, the clock pulse $\phi R$ shown in FIG. 10 is applied to the FDA reset gate 9 to open the FDA reset gate 9. At this time, since a constant-voltage power supply (not shown) is connected to the FDA reset drain 10, potential of the output diode 12 increases and a high voltage is applied to the output terminal 8.

Then, the clock pulse $\phi R$ applied to the FDA reset gate 9 decreases to "L" level and a potential well is created opposite the output diode 12. In this state, if the read-out clock pulse $\phi H2$ shown in FIG. 5, the pulse width of which is shorter than that of the conventional read-out clock pulse $\phi H1$ shown in FIG. 10, is applied to the horizontal scanner gate 5, the horizontal scanner gate 5 is open, i.e., the potential barrier under the horizontal scanner gate 5 is lowered, during a time interval equivalent to the pulse width of the read-out clock $\phi H2$, whereby electrical charges stored in the potential well under the storage gate 40 are transferred to the potential well under the output diode 12.

During the charge transfer, in addition to the self induced drift and thermal diffusion of the electrical charge itself, an electric field in the charge transfer direction is caused by the increase in the depth of the potential well under the storage gate 40, and the electric field increases the charge transfer speed, especially in the final stage of the transfer operation where a small quantity of charges remain in the potential well. When the electrical charges are thus transferred to the potential well under the output diode 12, an output signal DVo 2 shown in FIG. 5(b) is obtained from the output terminal 8. This output signal DVo 2 is obtained by the reduction in the voltage level at the output terminal 8 according to the quantity of charges transferred to the potential well under the output diode 12. Since the charge transfer speed, i.e., charge read-out speed, is increased in this embodiment as compared with the conventional one, the voltage shape of the output signal DVo 2 shown in FIG. 5(b) shows a sudden attenuation as compared with the output signal DVo 1 of the conventional device. As a result, the actual read-out time A of this embodiment is shorter than the actual read-out time B of the conventional device.

In the infrared imaging array according to the first embodiment of the present invention, since the thickness of the insulating film 70 underlying the storage gate 40 is reduced stepwise in the charge transfer direction, the depth of the potential well, which is created under the storage gate 40 by applying a prescribed voltage thereto, increases stepwise in the charge transfer direction. Therefore, when electrical charges stored in the potential well under the storage gate 40 are transferred to the potential well under the output diode 12, an electric field in the charge transfer direction caused by the increase in the depth of the potential well influences the electrical charges transferred, in addition to the self induced drift and thermal diffusion of the charges, thereby increasing the charge transfer speed and reducing the charge transfer time. Accordingly, when the infrared imaging array is operated in a TV frame while applying a charge read-out clock with a pulse width of 1 $\mu$s or less to the horizontal scanner gate 5 to produce an output image from a TV monitor, the quantity of charges transferred from the potential well under the storage gate 40 to the potential well under the output diode 12 significantly increases as compared with the conventional device, providing an improved image with improved resolution.

While in the above-described first embodiment the thickness of the insulating film 70 is varied in three stages, it may be varied in more stages.

While in the above-described first embodiment the thickness of the insulating film 70 is varied stepwise, it may be varied continuously.

Figure 2:
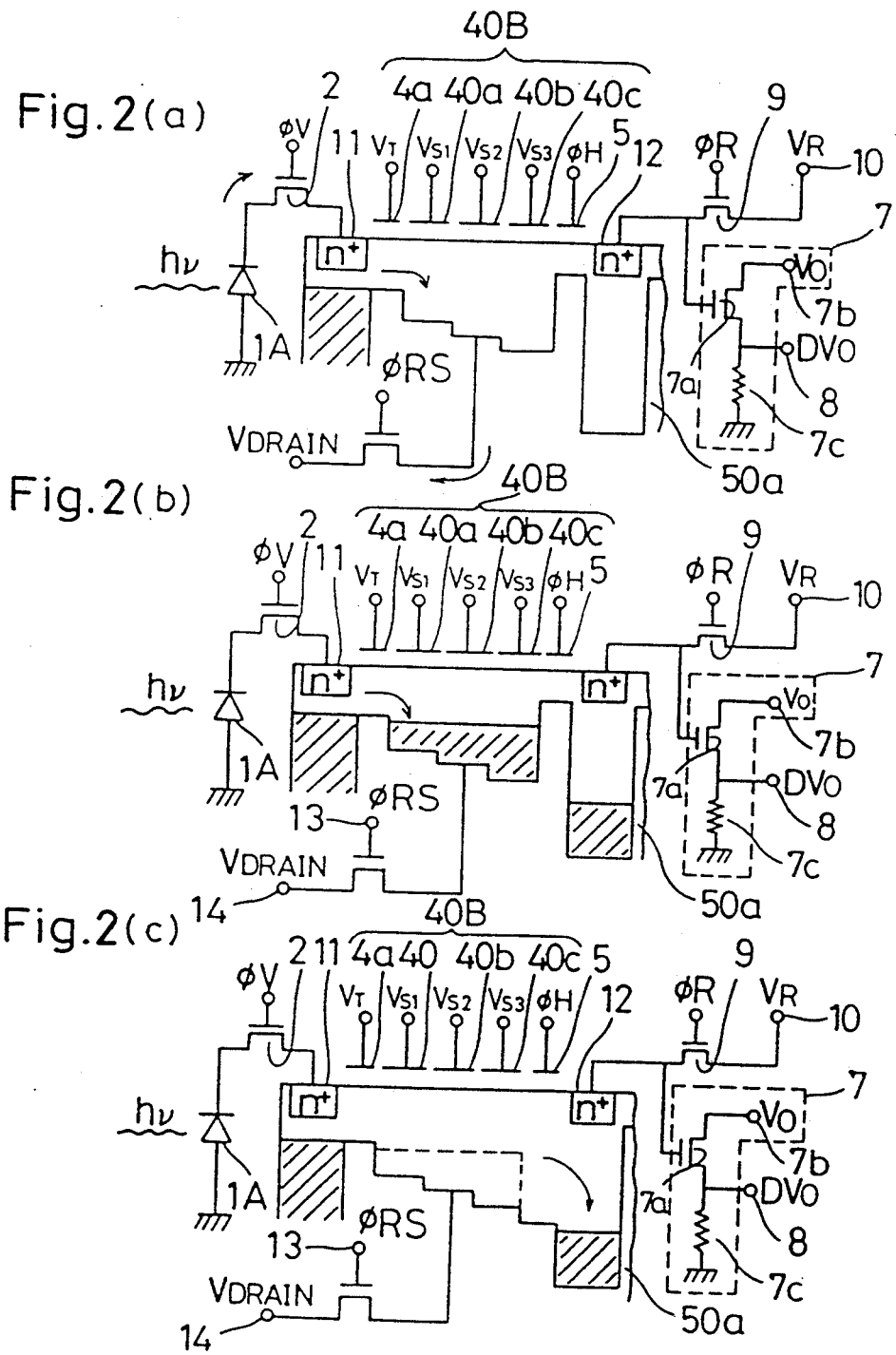
FIGS. 2(a)-2(c) are schematic diagrams illustrating signal processing circuitry of an infrared imaging array and potential wells created in a p type silicon substrate, in accordance with a second embodiment of the present invention.
Figure 4:
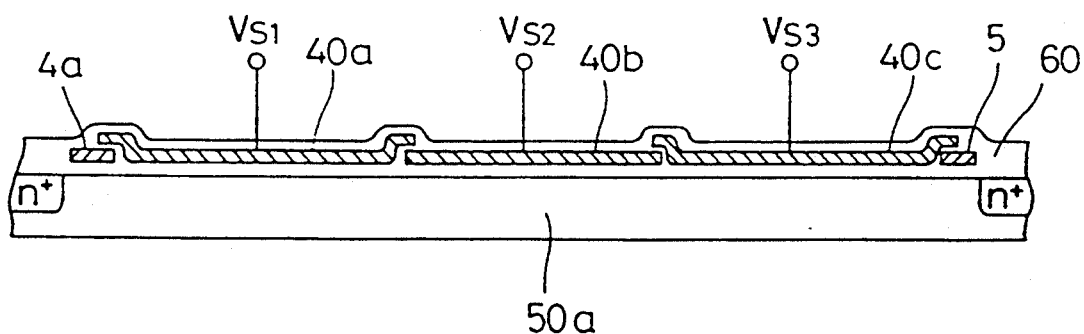
FIG. 4 is a cross-sectional view illustrating a charge storage gate and its vicinity included in the infrared imaging array according to the second embodiment of the present invention.

FIGS. 2(a) to 2(c) are schematic diagrams illustrating signal processing circuitry of an infrared imaging device according to a second embodiment of the present invention and potential wells produced in a p type silicon substrate. FIG. 4 is a cross-sectional view illustrating a charge storage gate and its vicinity included in the infrared imaging array according to the second embodiment. In this second embodiment, a charge storage capacitor 40B comprises an injection gate 4a and three storage gates 40a, 40b, and 40c to which different constant voltages $V_S1$, $V_S2$, and $V_S3$ are respectively applied. When the constant voltages $V_S1$, $V_S2$, and $V_S3$ having a relation of $V_S1 < V_S2 < V_S3$ are applied to the storage gates 40a, 40b, and 40c, respectively, electric field strengths under the respective storage gates increase in the order of 40a, 40b, and 40c, providing a potential well having a depth that increases stepwise in the charge transfer direction as shown in FIG. 2(a).

A description is given of the operation.

Figure 5:
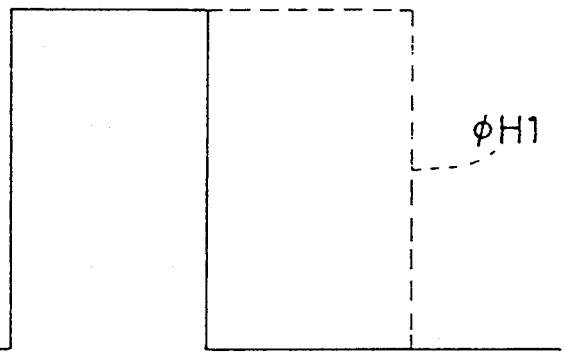
FIGS. 5(a) and 5(b) are schematic diagrams illustrating a pulse shape of a charge read-out clock $\phi H2$ and a voltage shape of an output signal DVo 2 according to the present invention in comparison with those according to the prior art.
Figure 5:
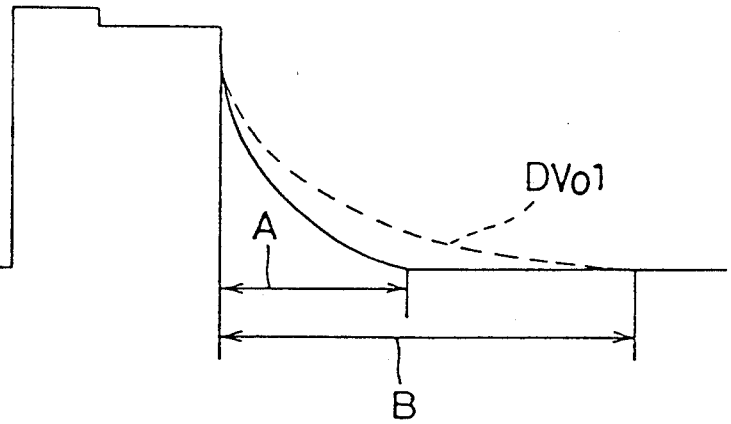

When the clock pulse $\phi RS$ applied to the overflow electrode 13 is at "L" level, electric charges transferred from the photodiode 1A are stored in the potential well opposite the storage gates 40a, 40b, and 40c. The depth of the potential well increases stepwise in the charge transfer direction. Then, the potential well under the output diode 12 is reset and a high voltage is applied to the output terminal 8 and, thereafter, the clock pulse $\phi R$ applied to the FDA reset gate 9 decreases to "L" level and a potential well is again created beneath the output diode 12. In this state, when the charge read-out clock pulse $\phi H2$ shown in FIG. 5 is applied to the horizontal scanner gate 5, the horizontal scanner gate 5 is open, i.e., the potential barrier under the horizontal scanner gate 5 is lowered, during a time interval equivalent to the pulse width of the read-out clock $\phi H2$, whereby electric charges stored in the potential well under the storage gates 40a, 40b, and 40c are transferred to the potential well under the output diode 12.

According to the second embodiment of the present invention, the charge storage capacitor 40B includes three electrodes 40a, 40b, and 40c, and constant voltages $V_S1$, $V_S2$, and $V_S3$ having a relation of $V_S1 < V_S2 < V_S3$ are applied to the storage gates 40a, 40b, and 40c, respectively, whereby a potential well with a depth of which increases stepwise in the charge transfer direction is formed under the storage gates. Therefore, when electric charges stored in the potential well are transferred to the potential well beneath the output diode 12, an electric field in the charge transfer direction is applied to the charges transferred, increasing the charge read-out speed of the infrared imaging array.

Since it is possible to control the strength and direction of the electric field by varying the voltages applied to the respective storage gates 40a, 40b, and 40c in each transfer operation an, optimum charge read-out time can be established precisely according to the quantity of electric charges in the potential well.

While in the above-described second embodiment the storage gate is divided into three to produce the three parts-stage potential well, it may be divided into four or more parts to produce four or more stage potential well.

What is claimed is:

1. An infrared imaging array comprising:
a substrate;
a plurality of photodetectors arranged in a two-dimensional array of rows and columns for producing electrical charges in response to incident light;
a vertical scanner for generating first charge read-out clock pulses;
a first charge read-out gate associated with each photodetector for reading out electrical charges from the associated photodetector upon receiving first charge read-out clock pulses from said vertical scanner;
charge storage means connected to each column of said photodetectors and including a storage gate opposite which a potential well is formed in said substrate for storing electrical charges read out from said photodetectors in the potential well;
a horizontal scanner for generating second charge read-out clock pulses;
a second charge read-out gate associated with each charge storage means for transferring electrical charges stored in the associated charge storage means to an output diode upon receiving second charge read-out clock pulses from said horizontal scanner; and
an output signal generating circuit for generating an output signal in accordance with the quantity of electrical charges transferred to said output diode wherein the potential well created opposite said storage gate in said substrate has a depth that increases in a charge transfer direction.

2. The infrared imaging array of claim 1 wherein the second charge read-out clock pulses have pulse widths of no more than 1 μm.

3. The infrared imaging array of claim 1 including an insulating film disposed between and contacting said storage gate and said substrate, said insulating film having a thickness decreasing in at least three steps in the charge transfer direction.

4. The infrared imaging array of claim 3 wherein the second charge read-out clock pulses have pulse widths of no more than 1 μm.

5. The infrared imaging array of claim 1 wherein said storage gate is divided into at least three parts in the charge transfer direction and voltages applied to the respective storage gate parts increase in the charge transfer direction.

6. The infrared imaging array of claim 5 wherein the second charge read-out clock pulses have pulse widths of no more than 1 μm.

* * * * *